US009444073B2

(12) United States Patent
Cho et al.

(10) Patent No.: US 9,444,073 B2
(45) Date of Patent: Sep. 13, 2016

(54) ORGANIC LIGHT EMITTING DISPLAY DEVICE AND MANUFACTURING METHOD THEREOF

(71) Applicant: Samsung Display Co., Ltd., Yongin, Gyeonggi-do (KR)

(72) Inventors: Yoon-Hyeung Cho, Yongin (KR); Min-Ho Oh, Yongin (KR); Byung-Duk Lee, Yongin (KR); Yong-Tak Kim, Yongin (KR); So-Young Lee, Yongin (KR); Jong-Woo Kim, Yongin (KR)

(73) Assignee: Samsung Display Co., Ltd., Gyeonggi-Do (KR)

( * ) Notice: Subject to any disclaimer, the term of this patent is extended or adjusted under 35 U.S.C. 154(b) by 226 days.

(21) Appl. No.: 13/970,206

(22) Filed: Aug. 19, 2013

(65) Prior Publication Data

US 2014/0103309 A1 Apr. 17, 2014

(30) Foreign Application Priority Data

Oct. 15, 2012 (KR) ........................ 10-2012-0114067

(51) Int. Cl.
*H01L 21/00* (2006.01)
*H01L 51/52* (2006.01)
*H01L 51/56* (2006.01)

(52) U.S. Cl.
CPC ........... *H01L 51/5253* (2013.01); *H01L 51/56* (2013.01)

(58) Field of Classification Search
CPC ............................. H01L 51/5253; H01L 1/56
See application file for complete search history.

(56) References Cited

U.S. PATENT DOCUMENTS 8,253,158 B2 * 8/2012 Shimizu .............. H01L 27/3211 257/40
2011/0062846 A1 3/2011 Song et al.
2011/0140163 A1 * 6/2011 Oh ...................... H01L 51/5256 257/100
2012/0153308 A1 6/2012 Oh et al.

FOREIGN PATENT DOCUMENTS

KR 10-2005-0092934 A 9/2005
KR 10-2006-0040234 A 5/2006
KR 10-2011-0029027 A 3/2011
KR 10-2012-0067730 A 6/2012

* cited by examiner

*Primary Examiner* — Laura Menz
(74) *Attorney, Agent, or Firm* — Knobbe Martens Olson & Bear LLP

(57) ABSTRACT

In an embodiment of the present disclosure, a polymer layer is formed on a second electrode of an organic light emitting display device.

6 Claims, 5 Drawing Sheets

600 500 300 400 210 100 200

ORGANIC LIGHT EMITTING DISPLAY DEVICE AND MANUFACTURING METHOD THEREOF

CROSS-REFERENCE TO RELATED APPLICATIONS

This application is claims priority to and the benefit of Korean Patent Application No. 10-2012-0114067, filed on Oct. 15, 2012 in the Korean Intellectual Property Office, the disclosure of which is incorporated herein by reference in its entirety.

BACKGROUND

1. Field

The present disclosure relates to an organic light emitting display device and a manufacturing method thereof, and more particularly, to an organic light emitting display device with improved stability of a light emission layer and a manufacturing method thereof.

2. Description of the Related Technology

An organic light emitting display device may include a self-emission display device including an organic light emitting diode that emits light to display an image. Since the organic light emitting display device has characteristics such as low power consumption, high luminance, and a high response speed, the organic light emitting display device currently receives attention as a display device.

In general, the organic light emitting display device includes a hole injection electrode, a light emission layer, and an electron injection electrode. In the organic light emitting display device, a hole supplied from the hole injection electrode and an electron supplied from the electron injection electrode are coupled with each other in the light emission layer to form an exciton, and light is generated by energy generated when the exciton falls in the ground state.

In the manufacture of an organic light emitting display device, a method of forming the light emission layer may include, for example, a deposition method, a transfer method, and the like.

The transfer method is a method of forming the light emission layer by transferring a light emitting material coated on a donor film to a portion formed for the light emission layer of the organic light emitting display device. For example, a donor film may be disposed over the organic light emitting display device which is a transfer target, heat and the like are selectively applied to the donor film, a light emission material coated on the donor film may be transferred to the corresponding portion of the organic light emitting display device, and then the donor film may be removed to perform transfer only at the corresponding portion, thereby forming the light emission layer.

However, the transfer method includes stripping of the light emission material at an end of the light emission layer portion when removing the donor film, and as a result, an edge of the light emission layer portion may become rough, a protrusion may be generated, or a void may be generated. Electrodes and the like may be disposed on the light emission layer, and a shape of the stripped trace or the protrusion of the light emission layer influences the structure of the electrode, and as a result, the surface of the electrode and the like may become non-uniform. Resultantly, a crack may be generated in the thin film sealing layer and a thin film sealing layer material may not be coated well when the thin film sealing layer is formed on the electrode.

Deterioration in quality of the organic light emitting display device may be generated when the uneven surface is not modified.

SUMMARY

In an exemplary embodiment of the present disclosure, a polymer layer is disposed on a second electrode of an organic light emitting display device in order to cover an uneven surface of a diode generated by stripping an end of a light emission layer.

In an embodiment of the present disclosure, a polymer layer may be disposed on a second electrode formed on a light emission layer to decrease non-uniformity of the surface due to a stripped trace, a protrusion, a crack or the like generated in the forming process of the light emission layer. In the case where the non-uniformity of the surface is decreased by the polymer layer, a defect may be reduced in the forming process of a thin film sealing layer and damage on the thin film sealing layer may be prevented.

Another embodiment of the present disclosure provides a manufacturing method of an organic light emitting display device.

An embodiment of the present disclosure provides an organic light emitting display device, including: a substrate; a first electrode formed on the substrate; a light emission layer formed on the first electrode; a second electrode formed on the light emission layer; a polymer layer formed on the second electrode; and an sealing layer formed on the polymer layer.

In some embodiments, the polymer layer may contain at least one of a silicon-based polymer film, an acryl-based polymer film, a vinyl-based polymer film, a rubber-based polymer film, and a urethane-based polymer film.

In some embodiments, the polymer layer may comprise an adhesive polymer. In some embodiments, the thickness of the polymer layer may be in a range of from about 10 μm to about 500 μm.

In some embodiments, the adhesive polymer may contain at least one of a silicon-based adhesive, an acryl-based adhesive, a vinyl-based adhesive, a rubber-based adhesive, and a urethane-based adhesive.

In some embodiments, the light emission layer may be formed by a transfer method using a transfer donor film. In some embodiments, the second electrode has a surface and a portion of the surface may be uneven.

In some embodiments, the sealing layer may include an inorganic layer and an organic layer which are alternately laminated.

In some embodiments, a pixel defining layer partitioning the first electrodes by a pixel unit may be disposed at an edge of the first electrode.

Another embodiment of the present disclosure provides a manufacturing method of an organic light emitting display device, including: forming a first electrode on a substrate; forming a light emission layer on the first electrode; forming a second electrode on the light emission layer; forming a polymer layer on the second electrode; and forming a sealing layer on the polymer layer.

In some embodiments, the forming of the polymer layer may include disposing a polymer film on the second electrode. For example, the polymer film may be attached to the second electrode.

In some embodiments, the polymer film may contain at least one of a silicon-based polymer film, an acryl-based polymer film, a vinyl-based polymer film, a rubber-based polymer film, and a urethane-based polymer film.

In some embodiments, the forming of the polymer layer may include attaching an adhesive polymer tape to the second electrode.

In some embodiments, the adhesive polymer tape may include a base sheet and an adhesive layer disposed on the base sheet, and the attaching of the adhesive polymer tape to the second electrode may include attaching the adhesive layer of the adhesive polymer tape to the second electrode; and removing the base sheet.

In some embodiments, the adhesive layer may contain at least one of a silicon-based adhesive, an acryl-based adhesive, a vinyl-based adhesive, a rubber-based adhesive, and a urethane-based adhesive.

In some embodiments, the manufacturing method of an organic light emitting display device may further include pressing the adhesive polymer tape to the second electrode side, before removing the base sheet after attaching the adhesive layer of the adhesive polymer tape to the second electrode.

In some embodiments, the pressing may include applying air pressure to the adhesive polymer tape.

In some embodiments of the pressing, the adhesive polymer tape may be pressed by using a roller.

In some embodiments, the forming of the light emission layer may include performing transfer using a transfer donor film.

In some embodiments of the forming of the light emission layer, applying a laser to the transfer donor film may be performed to induce thermal imaging.

In the forming of the sealing layer, forming an inorganic layer made of an inorganic material and forming an organic layer made of an organic material may be alternately performed.

In some embodiments, the manufacturing method of an organic light emitting display device may further include forming a pixel defining layer at an edge of the first electrode, after forming the first electrode.

Another embodiment of the present disclosure provides a method of forming the organic light emitting display device, including: forming a first electrode on a substrate; forming a pixel defining layer partitioning the first electrodes by a pixel unit at an edge of the first electrode; forming a light emission layer on the first electrode by using a laser induced thermal imaging method; forming a second electrode all over the light emission layer and the pixel defining layer; disposing an adhesive polymer on the second electrode; forming a polymer layer by curing the adhesive polymer; and forming a sealing layer on the polymer layer.

In the organic light emitting display device according to an embodiment of the present disclosure, a polymer layer is disposed on the second electrode to prevent a sealing layer from being damaged due to a stripped trace, a protrusion, a crack or the like generated in the forming process of the light emission layer. Particularly, the present disclosure may be usefully applied in the case where the light emission layer is formed by a transfer method using a donor film.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
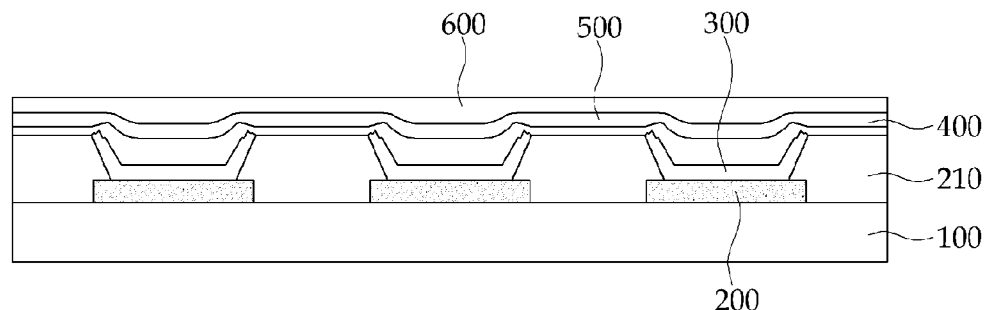
FIG. 1 is a cross-sectional view schematically illustrating a structure of an organic light emitting display device according to an embodiment of the present disclosure.

Hereinafter, the present disclosure will be described in detail with reference to embodiments illustrated in the drawings. The scope of the present disclosure is not limited to drawings or embodiments to be described below. The drawings only select and illustrate an example suitable for describing the present disclosure among various embodiments.

Respective components and shapes thereof were schematically drawn or exaggeratedly drawn in the accompanying drawings for easy understanding, and components in a real product are not illustrated and omitted. Therefore, the drawings should be analyzed in order to help understanding the present embodiments. Meanwhile, like reference numerals designate like components playing the same role in the drawings.

Further, it will be understood that when a layer or an element is described as being "on" another layer or element, it may be directly disposed on another layer or element, or an intervening layer or element may also be present therebetween.

An organic light emitting display device according to an embodiment of the present disclosure may include a substrate 100, a first electrode 200 formed on the substrate, a light emission layer 300 formed on the first electrode, a second electrode 400 formed on the light emission layer, a polymer layer 500 formed on the second electrode, and a sealing layer 600 formed on the polymer layer, as illustrated in FIG. 1.

In the embodiment illustrated in FIG. 1, a top emission type organic light emitting display device in which light generated from the light emission layer is displayed in the second electrode 400 direction which is opposite to the substrate 100 is exemplified. Hereinafter, embodiments will be described based on the top emission type organic light emitting display device as illustrated in FIG. 1.

Figure 2:
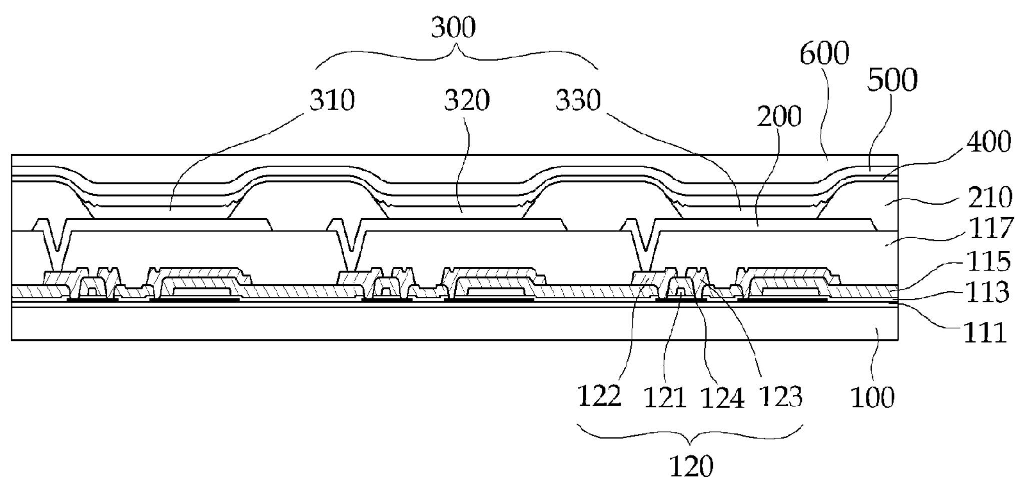
FIG. 2 is a schematic cross-sectional view illustrating an organic light emitting display device according to an embodiment of the present disclosure, in which the substrate 100 and a lower structure are particularly illustrated in more detail.

FIG. 2 is a schematic cross-sectional view illustrating an organic light emitting display device according to an embodiment of the present disclosure, in which the substrate 100 and a lower structure are particularly illustrated in more detail.

First, the substrate 100 may be made of glass or polymer plastic which is generally used in the organic light emitting display device. In some embodiments, the substrate 100 may be transparent or may not be transparent. In some embodiments, the substrate 100 may be properly selected and used according to the need of those skilled in the art.

In some embodiments, the first electrode 200 may be disposed on the substrate 100.

As illustrated in FIG. 2, a plurality of thin film transistors 120 may be formed on the substrate 100 before forming the first electrode 200. In some embodiments, the thin film transistor 120 includes a gate electrode 121, a drain electrode 122, a source electrode 123, and a semiconductor layer 124 which are formed on the substrate 100. Further, a gate insulating layer 113 and an interlayer insulating layer 115 are provided in the thin film transistor 120. The structure of the thin film transistor 120 is not limited to the form illustrated in FIG. 2 and may be configured as another form. Further, as the thin film transistor 120, various thin film transistors such as an organic thin film transistor in which the semiconductor layer 124 is made of an organic material and a silicon thin film transistor in which the semiconductor layer 124 is made of silicon may be included. In some embodiments, a buffer layer 111 made of silicon oxide or silicon nitride may be further included between the thin film transistor 120 and the substrate 100, if necessary.

In some embodiments, the first electrode 200, the light emission layer 300, and the second electrode 400 may be sequentially formed above the thin film transistors 120. In FIG. 2, the first electrode 200 is an anode as a pixel electrode which is electrically connected to the thin film transistor 120, and the second electrode 400 is a cathode.

In some embodiments, the first electrode 200 may be electrically connected with the thin film transistor 120 therebelow. In this case, when a planarization layer 117 covering the thin film transistor 120 is provided, the first electrode 200 is disposed on the planarization layer 117, and the first electrode 200 is electrically connected to the thin film transistor 120 through a contact hole provided in the planarization layer 117.

In some embodiments, the first electrode 200 may be provided as a transparent electrode or a reflective electrode. In the case where the first electrode 200 is provided as a transparent electrode, the first electrode 200 may be made of ITO, IZO, ZnO or $In_2O_3$, and in the case where the first electrode 200 is provided as a reflective electrode, the first electrode 200 may include a reflective layer made of Ag, Mg, Al, Pt, Pd, Au, Ni, Nd, Ir, Cr, or a compound thereof and a layer made of ITO, IZO, ZnO or $In_2O_3$ thereon. In the case where the first electrode 200 is an anode, as a material of the first electrode 200, ITO may be generally used.

In FIG. 2, it is exemplified that the first electrode 200 serves as an anode and the second electrode 400 serves as a cathode, but polarities of the first electrode 200 and the second electrode 400 may be reversed.

A pixel defining layer 210 is provided between the first electrodes 200. In some embodiments, the pixel defining layer 210 may be made of a material having an insulation property, and partitions the first electrode 200 by a pixel unit. In detail, the pixel defining layer 210 is disposed at an edge of the first electrode 200 to partition the first electrode by a pixel unit and define pixel areas. That is, the pixel defining layer (PDL) 210 covers the edge of the first electrode 200. In some embodiments, the pixel defining layer 210 serves to prevent a short circuit between the first electrode 200 and the second electrode 400 by increasing a gap between the edge of the first electrode 200 and the second electrode 400 to prevent an electric field from being concentrated at the edge of the first electrode 200, in addition to serving to define the pixel area.

In some embodiments, the light emission layer 300 is provided between the first electrode 200 and the second electrode 400. That is, the light emission layer 300 is formed in an opening on the first electrode 200 partitioned by the pixel defining layer 210. The light emission layer 300 includes a red emission layer 310, a green emission layer 320, and a blue emission layer 330.

The light emission layer 300 may be formed by various methods, and for example, may be formed by a transfer method using a transfer donor film. As the transfer donor film, laser induced thermal imaging donor films 311 and 321 may be used. In some embodiments, the laser induced thermal imaging donor films include base substrates 317 and 327, light-heat conversion layers 315 and 325 formed on the base substrates 317 and 327, and transfer layers 313 and 323 formed on the light-heat conversion layers 315 and 325. In the case of irradiating a laser to the laser induced thermal imaging donor films 311 and 321, the light-heat conversion layers 315 and 325 convert the laser to heat to expand the transfer layers 313 and 323 positioned below the light-heat conversion layers, and as a result, the transfer layer is separated from the donor film to be transferred toward the substrate of the organic light emitting display device (see FIGS. 5D and 5E).

According to an embodiment, the transfer layer may contain a light emission material, and a corresponding portion of the transfer layer is transferred to the position of the light emission layer of the organic light emitting display device to form the light emission layer. In detail, the donor film is disposed on the organic light emitting display device which is a transfer object, a laser is selectively applied to only a target region of forming the light emission layer of the donor film, the light emission material included in the transfer layer of the donor film is transferred to the corresponding portion of the organic light emitting display device, and the donor film is removed. As such, the transfer is performed only in the portion corresponding to the light emission layer region to form the light emission layer.

In another exemplary embodiment, after a white emission material is coated, a color filter is formed on the white emission material to form the light emission layer 300. In this case, the transfer donor film may be used in the process of forming the color filter.

At least one of a hole injection layer, a hole transport layer, an electron transport layer, and an electron injection layer may be further provided between the first electrode 200 and the second electrode 400, in addition to the light emission layer 300. The light emission layer 300, the hole injection layer, the hole transport layer, the electron transport layer, and the electron injection layer are referred to as an organic layer. In some embodiments, the organic layer may be made of a low-molecular organic material or a high-molecular organic material.

In some embodiments, the low-molecular organic material may be applied to all of the hole injection layer, the hole transport layer, the light emission layer, the electron transport layer, and the electron injection layer. In some embodiments, the low-molecular organic material may be laminated in a single or complex structure, and the applicable organic material includes copper phthalocyanine (CuPc), N,N'-Di (naphthalene-1-yl)-N,N'-diphenyl-benzidine (NPB), tris-8-hydroxyquinoline aluminum ($Alq_3$), and the like. In some embodiments, the light emission layer 300, the hole injection layer, the hole transport layer, the electron transport layer, or the electron injection layer may be formed by using the low-molecular organic material through a vacuum deposition method using a mask, or the like.

In some embodiments, the high-molecular organic material may be applied to a hole transport layer (HTL) and a light emission layer (EML). In this case, the hole transport layer may be made of PEDOT, and the light emission layer may be made of poly-phenylenevinylene (PPV)-based and polyfluorene-based high-molecular organic materials.

In some embodiments, the second electrode 400 may be formed on the light emission layer 300 and the pixel defining layer 210. The second electrode 400 may be made of a material which is generally used in the art. In some embodiments, the second electrode 400 may also be provided as a transparent electrode or a reflective electrode. When the second electrode 400 is provided as the transparent electrode, the second electrode may include a layer made of Li, Ca, LiF/Ca, LiF/Al, Al, Mg or a compound thereof and a layer made of a material for forming a transparent electrode such as ITO, IZO, ZnO, or $In_2O_3$ thereon. When the second electrode 400 is provided as the reflective electrode, the second electrode may be provided by depositing Li, Ca, LiF/Ca, LiF/Al, Al, Mg or a compound thereof. In the embodiment illustrated in FIGS. 1 and 2, since the top emission type organic light emitting display device is described, the second electrode 400 may be manufactured as the transparent electrode. For example, the second electrode 400 may be formed by using LiF/Al.

In some embodiments, a polymer layer 500 is disposed on the second electrode 400.

In some embodiments, the polymer layer 500 is disposed on the second electrode 400 to soften the surface of the second electrode 400. For example, in the case where the light emission layer is formed by a laser induced thermal imaging method, stripping of the transfer layer is generated at an end of the light emission layer when removing the donor film, and as a result, a stripped trace remains or a protrusion or void may be generated at the edge of the light emission layer. In the case where the second electrode is formed on the light emission layer described above, a shape of the stripped trace, the protrusion, or the void in the light emission layer influences the second electrode as it is, and as a result, the surface of the second electrode is uneven. In this state, in the case where the sealing layer is formed on the second electrode, a crack may be generated in the sealing layer, and a material of forming the sealing layer is not coated well in the process of forming the sealing layer and thus there is a problem in that the sealing is not performed well.

When the uneven surface of the second electrode is left as it is, deterioration in quality of the organic light emitting display device may be generated due to deteriorated function of the sealing layer. Accordingly, the polymer layer 500 may be disposed on the second electrode 400 to decrease surface non-uniformity due to the protrusion or the crack which may exist on the surface of the second electrode 400.

In some embodiments, the polymer layer 500 may include at least one of a silicon-based polymer film, an acryl-based polymer film, a vinyl-based polymer film, a rubber-based polymer film, and a urethane-based polymer film. The kinds of silicon-based polymer film, acryl-based polymer film, vinyl-based polymer film, rubber-based polymer film, and urethane-based polymer film are not particularly limited, and commercially available products may be used. The polymer films forming the polymer layer need to have a light transmitting property and have elasticity and softness.

In an embodiment of the present disclosure, the silicon-based polymer film may be used as the polymer layer 500. In some embodiments, the silicon-based polymer film may contain polydimethylsiloxane (PDMS). In another embodiment of the present disclosure, the polymer layer 500 may be formed by the acryl-based polymer film. In some embodiments, the acryl-based polymer film may contain polymethylmethacrylate (PMMA).

In some embodiments, the polymer layer 500 may be formed by an adhesive polymer. In some embodiments, the adhesive polymer may include at least one of a silicon-based adhesive, an acryl-based adhesive, a vinyl-based adhesive, a rubber-based adhesive, and a urethane-based adhesive. The kinds of silicon-based adhesive, acryl-based adhesive, vinyl-based adhesive, rubber-based adhesive, and urethane-based adhesive are not particularly limited as the adhesive polymer, and commercially available products may also be used. The adhesive polymer forming the polymer layer needs to have a light transmitting property.

In order to form the polymer layer 500 by using the adhesive polymer, an adhesive polymer tape 510 may be used. In some embodiments, the adhesive polymer tape 510 includes a base sheet 501 and an adhesive layer 502 formed on the base sheet. In the case of a commercially available adhesive polymer tape 510, a release layer 503 may be disposed on the adhesive layer 502.

Figure 3:
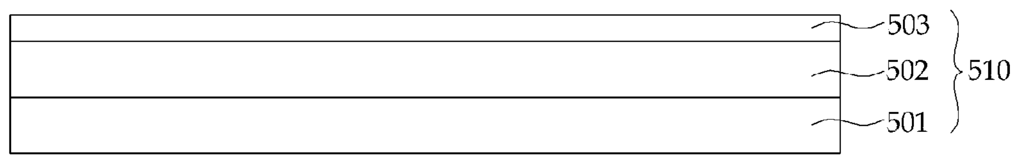
FIG. 3 is a diagram illustrating an example of an adhesive polymer tape which may be applied for forming a polymer layer.

In FIG. 3, an example of the adhesive polymer tape 510 is illustrated. Referring to FIG. 3, the adhesive polymer tape 510 includes the base sheet 501, the adhesive layer 502 formed on the base sheet, and the release layer 503 disposed on the adhesive layer 502. In some embodiments, the adhesive layer may include at least one of a silicon-based adhesive, an acryl-based adhesive, a vinyl-based adhesive, a rubber-based adhesive, and a urethane-based adhesive.

In the case where the polymer layer is formed by using the adhesive polymer tape 510, first, the release layer 503 is removed, the adhesive layer 502 is attached to the second electrode 400, and then the base sheet 501 is removed to form the polymer layer. If necessary, the adhesive layer 502 may be cured. For curing, a method such as photocuring or thermal curing may be applied.

A thickness of the polymer layer 500 is not particularly limited. The polymer layer 500 needs to be formed to have a thickness enough to cover the protrusion or the crack formed on the surface of the second electrode 400. In some embodiments, the thickness of the polymer layer 500 may be, for example, about 10 μm to 500 μm. When the thickness of the polymer layer 500 is less than 10 μm, the protrusion or the crack formed on the surface of the second electrode 400 may not be covered, and when the thickness of the polymer layer 500 is more than 500 μm, the thickness may be an obstacle to slim the organic light emitting display device.

In some embodiments, a sealing layer 600 is disposed on the polymer layer 500.

The sealing layer 600 may also be referred to as an encapsulation layer. In some embodiments, the sealing layer 600 serves to protect the organic light emitting diode unit from an external environment.

In some embodiments, the sealing layer 600 may be formed in a single layer or may be formed in a multilayer, and in an embodiment of the present disclosure, the sealing layer 600 is formed in the multilayer. That is, in the organic light emitting diode display according to an embodiment of the present disclosure, the sealing layer 600 has a plurality of thin film layers.

Figure 4:
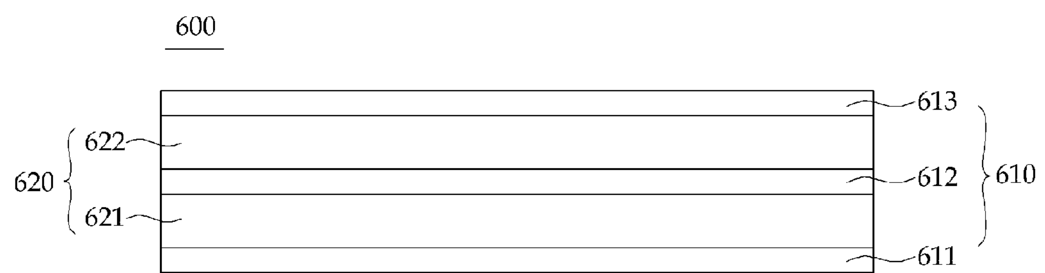
FIG. 4 is a diagram illustrating an example of a structure of a sealing layer 600 in which inorganic layers 611, 612, and 613 and organic layers 621 and 622 are alternately laminated in the organic light emitting display device according to an embodiment of the present disclosure.

FIG. 4 illustrates a structure of the sealing layer 600 in the organic light emitting display device according to an embodiment of the present disclosure in more detail. As illustrated in FIG. 4, the sealing layer includes inorganic layers 611, 612, and 613 and organic layers 621 and 622 which are alternately laminated.

In some embodiments, the sealing layer 600 may be thickly formed in several layers from the viewpoint of protection of the organic light emitting diode unit such as the light emission layer 300 and the electrodes 200 and 400. In some embodiments, the sealing layer 600 may be thinly formed from the viewpoint of slimness of the organic light emitting display device. In some embodiments, the inorganic layers and the organic layers may be laminated with 2 to 30 layers, respectively. That is, when one inorganic layer and one organic layer which are laminated are referred to as a pair of layers, 2 to 30 pairs of layers may be formed.

In some embodiments, an overall thickness of the sealing layer may be in the range of 10 to 100 μm. The thickness of the sealing layer is determined by considering protection of the organic light emitting diode unit and slimness of the organic light emitting display device.

In some embodiments, the inorganic layers 611, 612, and 613 included in the sealing layer 600 may be the same kind of inorganic thin film layers or may be different kinds of inorganic thin film layers. Similarly, the organic layers 621 and 622 included in the sealing layer 600 may be the same kind of organic thin film layers or may be different kinds of organic thin film layers.

The kind of organic layer may depend on a unique characteristic of the used organic material and a method of polymerizing monomers for forming the organic layer. In some embodiments, the organic layer may be formed by using a conventionally known organic thin film material in the art. The organic thin film material is not particularly limited.

For example, the organic layer may be formed by forming a film through a method such as evaporation, silkscreen, or coating by using liquid monomers or gel-stated monomers in which a liquid state and a solid state coexist with each other, and then photo-polymerizing the formed film by ultraviolet light or visible light. In some embodiments, the monomers which may be applied to the above method include, for example, diazo-based, azide-based, acryl-based, polyamide-based, polyester-based, epoxide-based, polyether-based, urethane-based monomers and the like. These monomers may be used either alone or in combination of two or more kinds.

In some embodiments, the organic layer may also be formed by a thermal polymerization method in which radicals generated by heating the monomers start polymerization reaction. In this case, usable monomers include such monomers for forming polystyrene-based, acryl-based, urea-based, isocyanate-based, and xylene-based resins. These monomers may be used either alone or in combination of two or more kinds.

In some embodiments, the organic layer may be formed by another method which is known in the art, and for example, the organic layer may be formed by an atomic layer deposition or chemical vapor deposition (CVD) method.

A thin film material and a laminating method of the inorganic thin film layer are not particularly limited, and conventionally known method may be applied.

In some embodiments, the thin film material may include at least one of silicon nitride, aluminum nitride, zirconium nitride, titanium nitride, hafnium nitride, tantalum nitride, silicon oxide, aluminum oxide, titanium oxide, zirconium oxide, magnesium oxide, titanium oxide, tin oxide, cerium oxide, silicon oxide nitride (SiON), ITO, and the like. As the laminating method thereof, a vacuum film formation method such as sputtering, chemical vapor deposition (CVD), e-beam, thermal deposition, and thermal ion beam assisted deposition (IBAD) may be used. The CVD method may include induced coupled plasma-chemical vapor deposition (ICP-CVD), capacitively coupled plasma (CCP)-CVD, surface wave plasma (SWP)-CVD methods, and the like.

In some embodiments, the inorganic layer may have a thickness of 0.1 to 1 μm for each layer, and the organic layer may have a thickness of 0.5 to 3 μm for each layer. Further, a refractive index of the inorganic layer may be in the range of 1.6 to 2.5, and a refractive index of the organic layer may be in the range of 1.3 to 1.5.

Although not illustrated in the drawing, a window member made of a material such as glass or plastic may be disposed on the sealing layer 600. In some embodiments, the window member may be disposed to be in close contact with the sealing layer 600 or to be spaced apart from the sealing layer 600.

Further, an embodiment of the present disclosure provides a manufacturing method of an organic light emitting display device.

A manufacturing method of an organic light emitting display device according to an embodiment of the present disclosure includes forming a first electrode 200 on a substrate 100, forming a light emission layer 300 on the first electrode 200, forming a second electrode 400 on the light emission layer 300, forming a polymer layer 500 on the second electrode 400, and forming a sealing layer 600 on the polymer layer 500.

FIGS. 5A to 5K sequentially illustrate a manufacturing process of an organic light emitting display device according to an embodiment of the present disclosure.

Figure 5A:
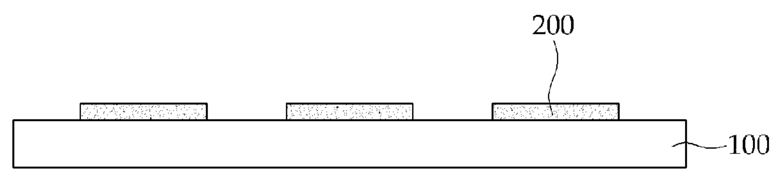
FIGS. 5A to 5K are diagrams schematically illustrating a manufacturing process of an organic light emitting display device according to an embodiment of the present disclosure.

In order to manufacture the organic light emitting display device, first, the first electrode 200 is formed on the substrate 100 (see FIG. 5A).

Figure 5B:
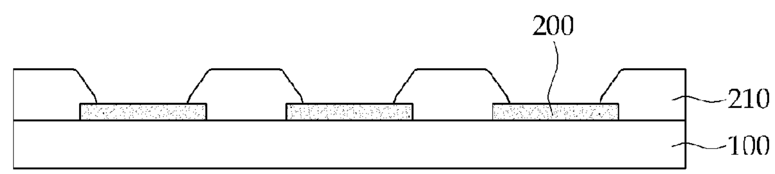

In some embodiments, a pixel defining layer 210 may be formed between the first electrodes 200 (see FIG. 5B). The pixel defining layer 210 is made of a material having an insulation property, and partitions the first electrode 200 by a pixel unit.

In some embodiments, the light emission layer 300 may be formed in an opening on the first electrode 200 partitioned by the pixel defining layer 210 by a pixel unit. In some embodiments, the light emission layer 300 includes a red emission layer 310, a green emission layer 320, and a blue emission layer 330.

In the embodiment, a method of forming the light emission layer 300 formed in a structure having a blue common emission layer will be described as an example.

Figure 5C:
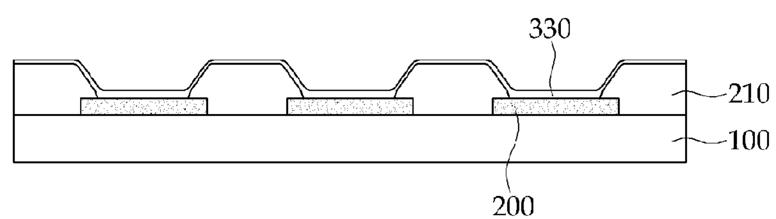

In order to form the light emission layer 300, first, a blue emission layer 330 is formed all over the first electrode 200 and the pixel defining layer 210 (see FIG. 5C). In some embodiments, the blue emission layer becomes the common emission layer.

Subsequently, the red emission layer and the green emission layer are sequentially formed on the blue common emission layer. In the embodiment, transferring using a transfer donor film is included. In detail, a method of forming the red emission layer and the green emission layer by a laser induced thermal imaging method will be described. To this end, as the donor film, laser induced thermal imaging donor films 311 and 321 may be used.

In some embodiments, the laser induced thermal imaging donor films may include base substrates 317 and 327, light-heat conversion layers 315 and 325 formed on the base substrates 317 and 327, and transfer layers 313 and 323 formed on the light-heat conversion layers 315 and 325.

Figure 5D:
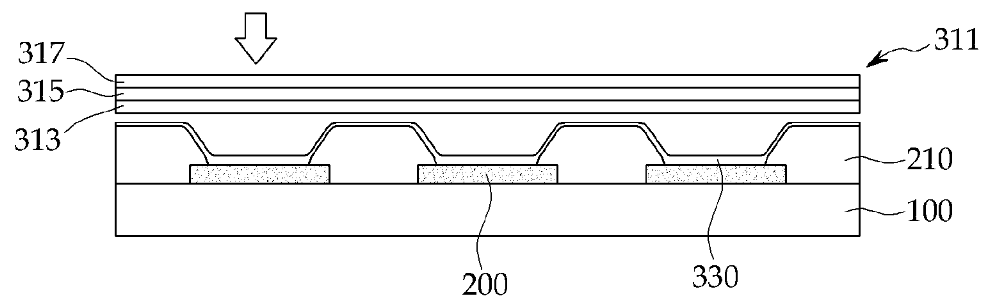

First, the laser induced thermal imaging donor film 311 for forming the red emission layer is disposed on the blue emission layer 330 and then a laser is irradiated only in a red emission region (see FIG. 5D). A part of the transfer layer 313 containing a red emission material is transferred in the red emission region by irradiating the laser. In detail, the light-heat conversion layer 315 converts the laser into the heat by the laser irradiation to expand the transfer layer 313 disposed below the light-heat conversion layer 315 and the transfer layer 313 is separated from the donor film to be transferred to the substrate side to form the red emission layer 310 (see FIG. 5E).

Figure 5E:
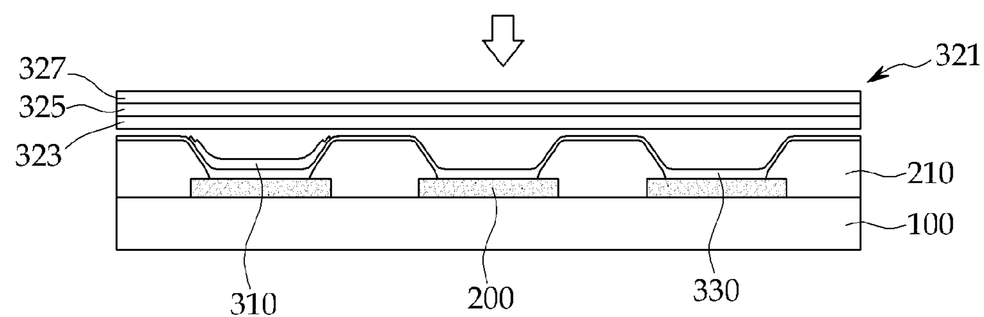

Next, the laser induced thermal imaging donor film 321 for forming the green emission layer is disposed on the blue emission layer 330 and then the laser is irradiated only in a green emission region (see FIG. 5E). A part of the transfer layer 323 containing a green emission material may be transferred in the green emission region by irradiating the laser. In some embodiments, the light-heat conversion layer 325 converts the laser into heat by the laser irradiation to expand the transfer layer 323 disposed below the light-heat conversion layer 325 and the transfer layer 323 is separated from the donor film to be transferred to the substrate side to form the green emission layer 320 (see FIG. 5F).

Figure 5F:
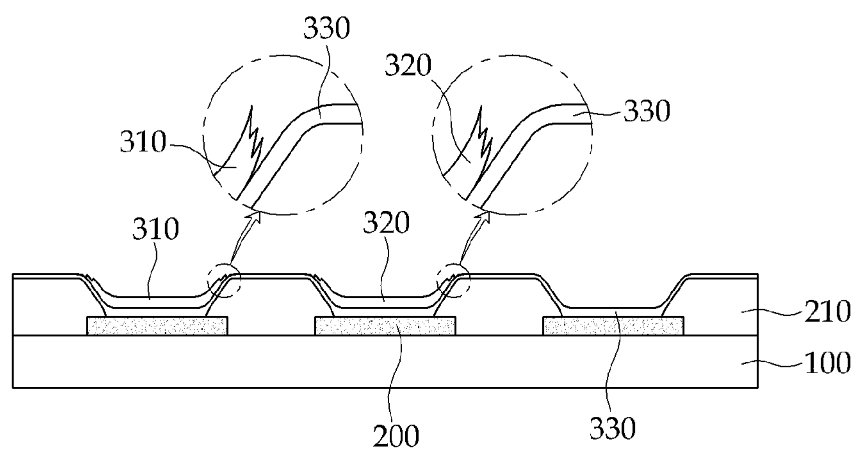

As a result, as illustrated in FIG. 5F, the light emission layer is formed. In addition to the light emission layer 300, at least one of a hole injection layer, a hole transport layer, an electron transport layer and an electron injection layer may be further formed.

Figure 5G:
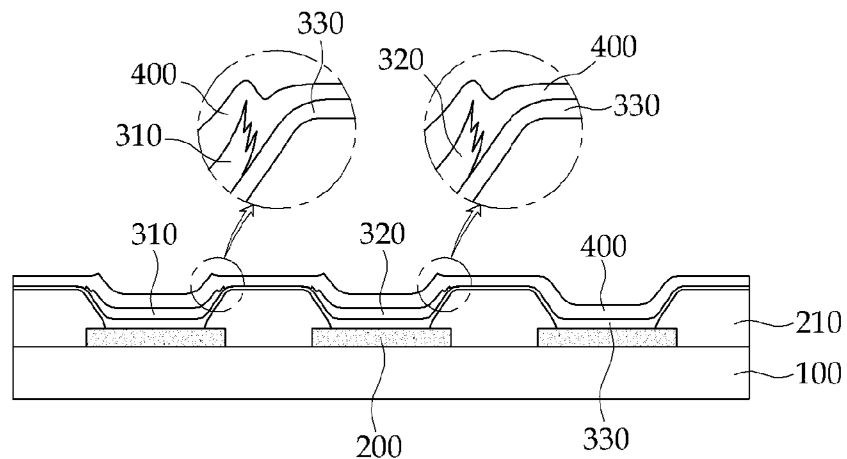

After forming the light emission layer 300, the second electrode 400 may be formed on the light emission layer 300 (see FIG. 5G).

In some embodiments, the polymer layer 500 may be formed on the second electrode 400.

In order to form the polymer layer 500, an adhesive polymer tape 510 may be used. In some embodiments, the adhesive polymer tape 510 may include a base sheet 501 and an adhesive layer 502 formed on the base sheet 501.

The adhesive polymer tape 510 may be manufactured by those skilled in the art according as his needs, and commercially available product may also be used. In some embodiments, a release layer 503 may be disposed on the adhesive layer 502 (see FIG. 3). In some embodiments, the adhesive polymer tape includes a pressure sensitive adhesive (PSA).

In some embodiments, the adhesive layer may contain at least one of a silicon-based adhesive, an acryl-based adhesive, a vinyl-based adhesive, a rubber-based adhesive, and a urethane-based adhesive. In some embodiments, the adhesive layer may use an adhesive polymer tape made of the silicon-based adhesive.

Figure 5H:
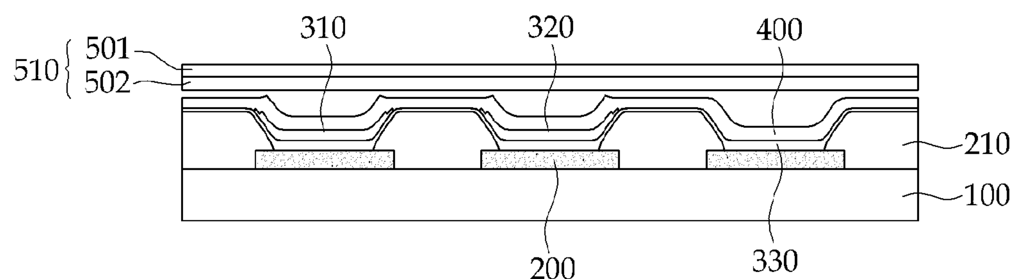

In order to form the polymer layer, the adhesive polymer tape 510 may be disposed on the second electrode 400 (see FIG. 5H). In the case where the release layer 503 is disposed on the adhesive polymer tape 510, after the release layer 503 is removed, the adhesive polymer tape 510 may be disposed on the second electrode 400 so that the adhesive layer 502 is attached to the second electrode 400.

In some embodiments, the adhesive polymer tape 510 may be disposed on the second electrode 400 and thus the adhesive polymer tape 510 may be attached to the second electrode 400, and the adhesive layer 502 of the adhesive polymer tape 510 may be attached to the second electrode 400 by applying pressure. That is, after the adhesive layer 502 of the adhesive polymer tape 510 is attached to the second electrode 400, the adhesive polymer tape 510 is pressed to the second electrode side (see FIG. 5I).

Figure 5I:
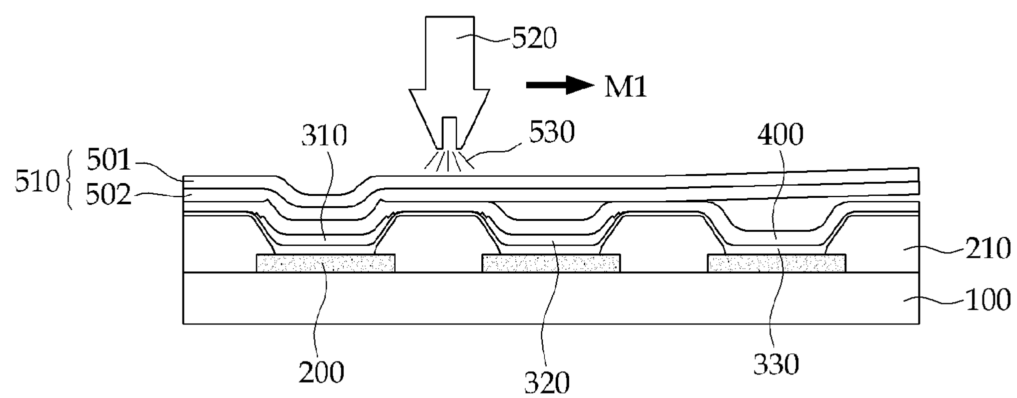
Figure 5J:
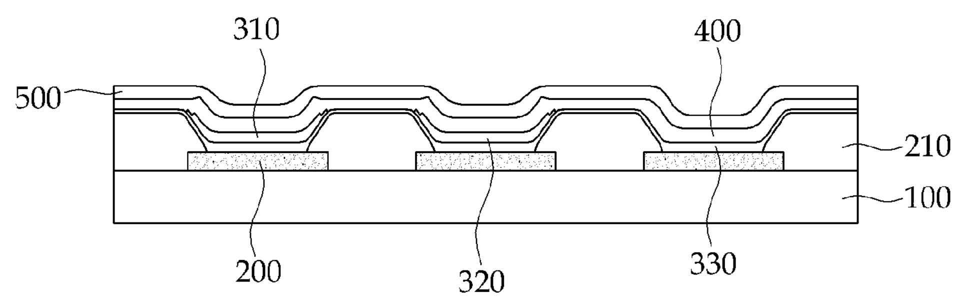

In the pressing of the adhesive polymer tape 510, as illustrated in FIG. 5I, there is a method of applying air pressure to the adhesive polymer tape. In some embodiments, in order to apply air pressure, an air injecting blade 520 may be used. In some embodiments, the adhesive layer 502 of the adhesive polymer tape 510 may be attached to the second electrode 400 by the aid of the pressure pressed by the air 530 injected from the air injecting blade 520. In some embodiments, the air injecting blade 520 may apply air pressure while moving in an arrow direction M1 illustrated in FIG. 5I.

In embodiments of the pressing process, the adhesive polymer tape may be pressed by using a roller.

Next, the adhesive layer is exposed by removing the base sheet 501. In some embodiments, the exposed adhesive layer 501 may be cured after removing the base sheet 501. For the curing, a method such as photo curing or thermal curing may be applied. In some embodiments, the adhesive layer may be cured by irradiating a ultraviolet light to the exposed adhesive layer to form the polymer layer 500 (see FIG. 5J).

The adhesive layer is referred to as an adhesive polymer. In some embodiments, the forming of the polymer layer may include disposing an adhesive polymer on the second electrode and forming a polymer layer by curing the adhesive polymer.

Unlike the above embodiment illustrated in the drawing, in the forming of the polymer layer, a polymer film may be directly disposed on the second electrode. In some embodiments, the polymer film may include at least one of a silicon-based polymer film, an acryl-based polymer film, a vinyl-based polymer film, a rubber-based polymer film, and a urethane-based polymer film. In some embodiments, the polymer film is as described above.

Figure 5K:
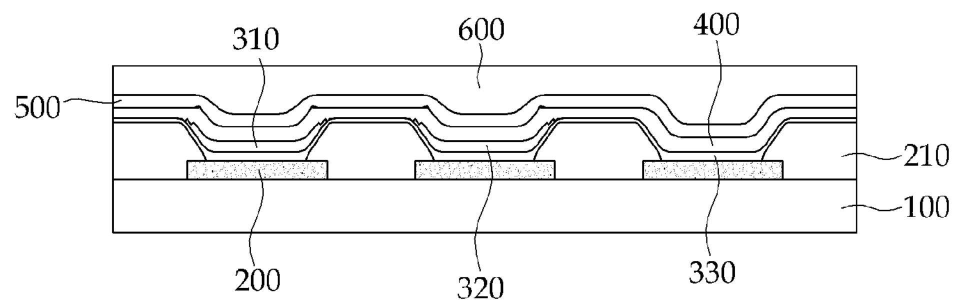

Next, a sealing layer 600 is formed on the polymer layer 500 (see FIG. 5K).

In the forming of the sealing layer 600, forming an inorganic layer made of an inorganic material and forming an organic layer made of an organic material are alternately performed.

In embodiments of the forming of the sealing layer 600, the forming of the inorganic layer and the forming of the organic layer may be alternately performed 2 to 30 times, respectively.

Although not illustrated in the drawing, forming the window member may be further included after forming the sealing layer 600. In some embodiments, the window member may be sealed together with the substrate 100 by using a bonding and sealing member and the like while facing the substrate 100.

A method of forming the organic light emitting display device according to another embodiment of the present disclosure may include forming a first electrode on a substrate; forming a pixel defining layer partitioning the first electrodes by a pixel unit at an edge of the first electrode; forming a light emission layer on the first electrode by using a laser induced thermal imaging method; forming a second electrode throughout the light emission layer and the pixel defining layer; disposing an adhesive polymer on the second electrode; forming a polymer layer by curing the adhesive polymer; and forming an sealing layer on the polymer layer.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. An organic light emitting display device, comprising:

a substrate;

a first electrode disposed on the substrate;

a light emission layer disposed on the first electrode;

a second electrode disposed on the light emission layer, wherein the second electrode has a first surface and a portion of the first surface is uneven;

a polymer layer disposed on the second electrode, wherein the polymer layer has an upper surface opposite the first surface and a portion of the upper surface is uneven; and a sealing layer disposed on the polymer layer, wherein the sealing layer includes 2 to 30 inorganic layers and 2 to 30 organic layer which are alternately laminated.

2. The organic light emitting display device of claim 1, wherein the polymer layer contains at least one of a silicon-based polymer film, an acryl-based polymer film, a vinyl-based polymer film, a rubber-based polymer film, and a urethane-based polymer film.

3. The organic light emitting display device of claim 1, wherein the polymer layer comprises an adhesive polymer.

4. The organic light emitting display device of claim 3, wherein the adhesive polymer contains at least one of a silicon-based adhesive, an acryl-based adhesive, a vinyl-based adhesive, a rubber-based adhesive, and an urethane-based adhesive.

5. The organic light emitting display device of claim 1, further comprising a pixel defining layer disposed at an edge of the first electrode.

6. The organic light emitting display device of claim 1, wherein the thickness of the polymer layer is in a range of from about 10 μm to about 500 μm.

* * * * *